United States Patent
Wada et al.

(10) Patent No.: US 8,727,680 B2
(45) Date of Patent: May 20, 2014

(54) CUTTING DRILL AND METHOD FOR MANUFACTURING PRINTED WIRING BOARD

(75) Inventors: Susumu Wada, Gifu (JP); Shunsuke Takeichi, Gifu (JP); Tomoko Sugiyama, Gifu (JP)

(73) Assignees: Ibiden Co., Ltd., Ogaki-shi (JP); Ibidenjushi Co., Ltd., Ibi-gun (JP)

( * ) Notice: Subject to any disclaimer, the term of this patent is extended or adjusted under 35 U.S.C. 154(b) by 1022 days.

(21) Appl. No.: 12/770,950

(22) Filed: Apr. 30, 2010

(65) Prior Publication Data
US 2010/0329802 A1 Dec. 30, 2010

Related U.S. Application Data

(60) Provisional application No. 61/221,733, filed on Jun. 30, 2009.

(51) Int. Cl.
*B23B 51/06* (2006.01)

(52) U.S. Cl.
USPC ............................... 408/226; 408/227

(58) Field of Classification Search
USPC ......................... 408/230, 226–227
See application file for complete search history.

(56) References Cited

U.S. PATENT DOCUMENTS

| | | | | |
|---|---|---|---|---|
| 535,939 A | * | 3/1895 | Brearley et al. | 408/230 |
| 3,806,270 A | * | 4/1974 | Tanner et al. | 408/56 |
| 4,579,180 A | * | 4/1986 | Peetz et al. | 175/394 |
| 2009/0016832 A1 | * | 1/2009 | Onose et al. | 408/59 |

FOREIGN PATENT DOCUMENTS

| | | | | | |
|---|---|---|---|---|---|
| JP | 2001087919 A | * | 4/2001 | | B23B 51/00 |
| JP | 2002-018623 | | 1/2002 | | |
| JP | 2002028809 A | * | 1/2002 | | B23B 51/00 |
| JP | 2002-137110 | | 5/2002 | | |
| JP | 2004283932 A | * | 10/2004 | | B23B 51/00 |
| JP | 2006043875 A | * | 2/2006 | | B23B 51/00 |
| SU | 464398 A | * | 9/1975 | | B23B 51/02 |

* cited by examiner

*Primary Examiner* — Daniel Howell
*Assistant Examiner* — Chwen-Wei Su
(74) *Attorney, Agent, or Firm* — Oblon, Spivak, McClelland, Maier & Neustadt, L.L.P.

(57) ABSTRACT

A cutting drill includes a shank having a hole and formed to be gripped in a tool holder, and a drill body having a rod shape and locked into the hole of the shank. The shank has an axis around which the drill body rotates. The drill body has a cutting-edge portion forming a tip portion of the drill body and a neck portion having a diameter smaller than a diameter of the cutting-edge portion. The cutting-edge portion has a first cutting-edge portion and a second cutting-edge portion formed between the first cutting-edge portion and the neck portion. The first cutting-edge portion is contiguous to the second cutting-edge portion by a step portion such that the second cutting-edge portion has a diameter which is smaller than a diameter of the first cutting-edge portion.

19 Claims, 7 Drawing Sheets

FIG. 1
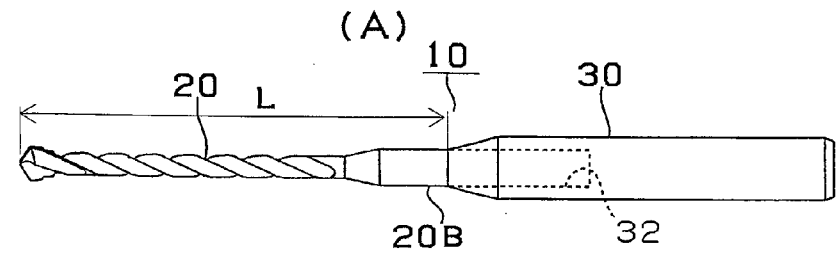
(A)
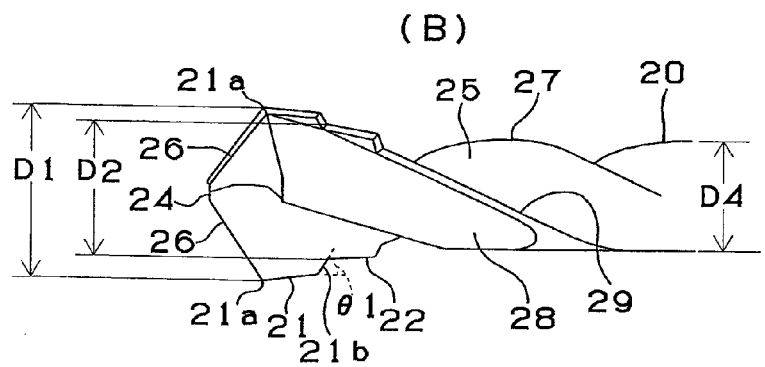
(B)
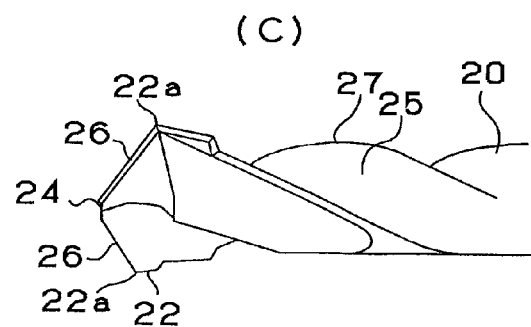
(C)
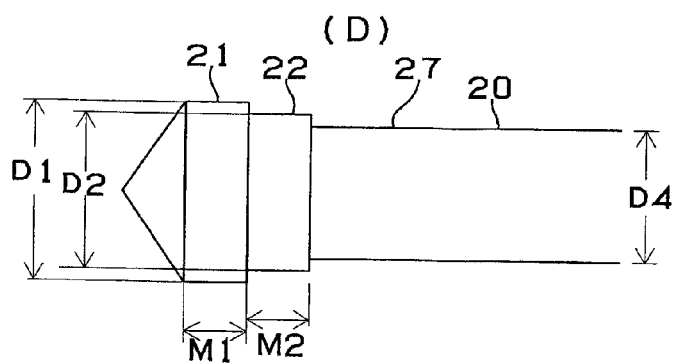
(D)

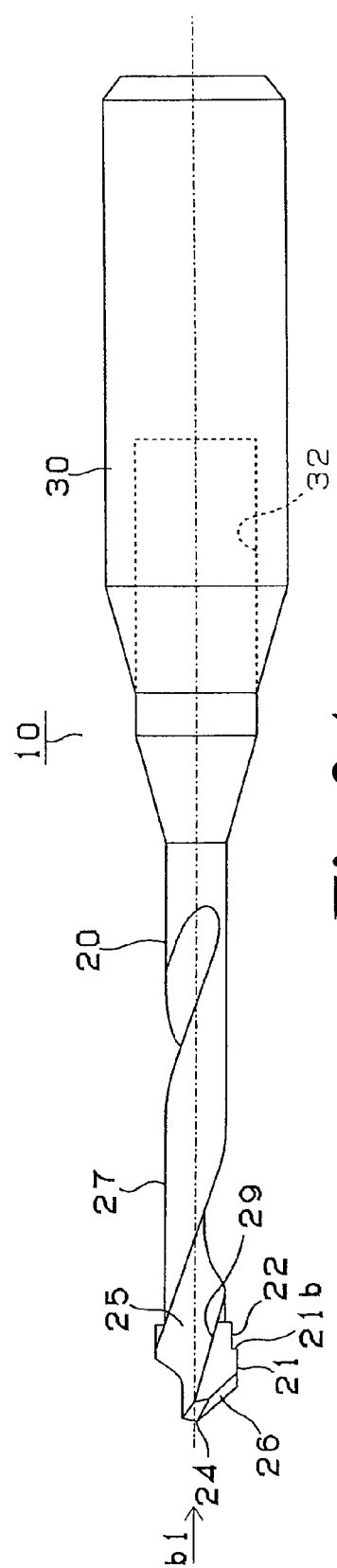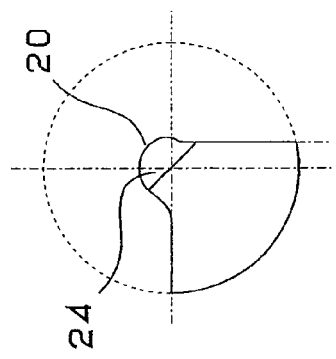
Fig.3A
Fig.3B

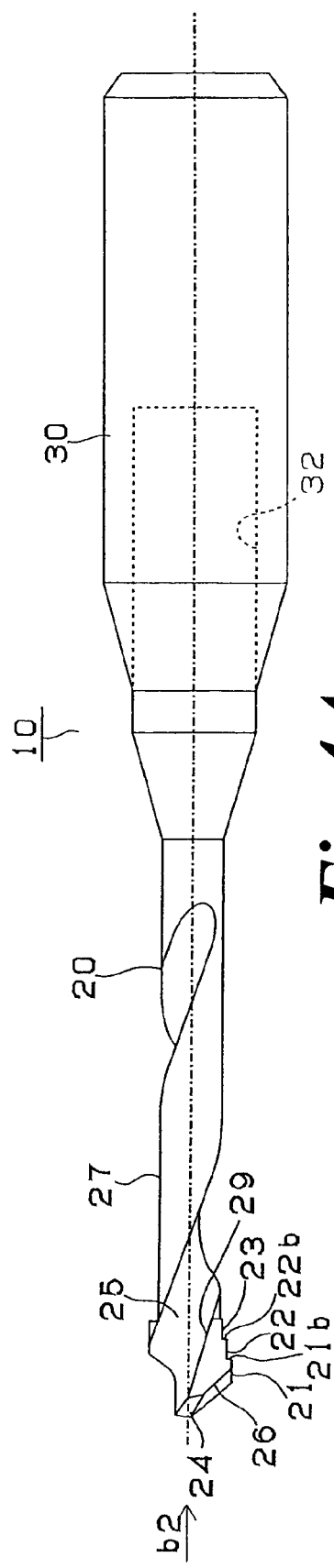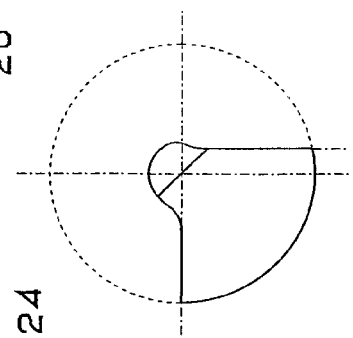
Fig.4A
Fig.4B

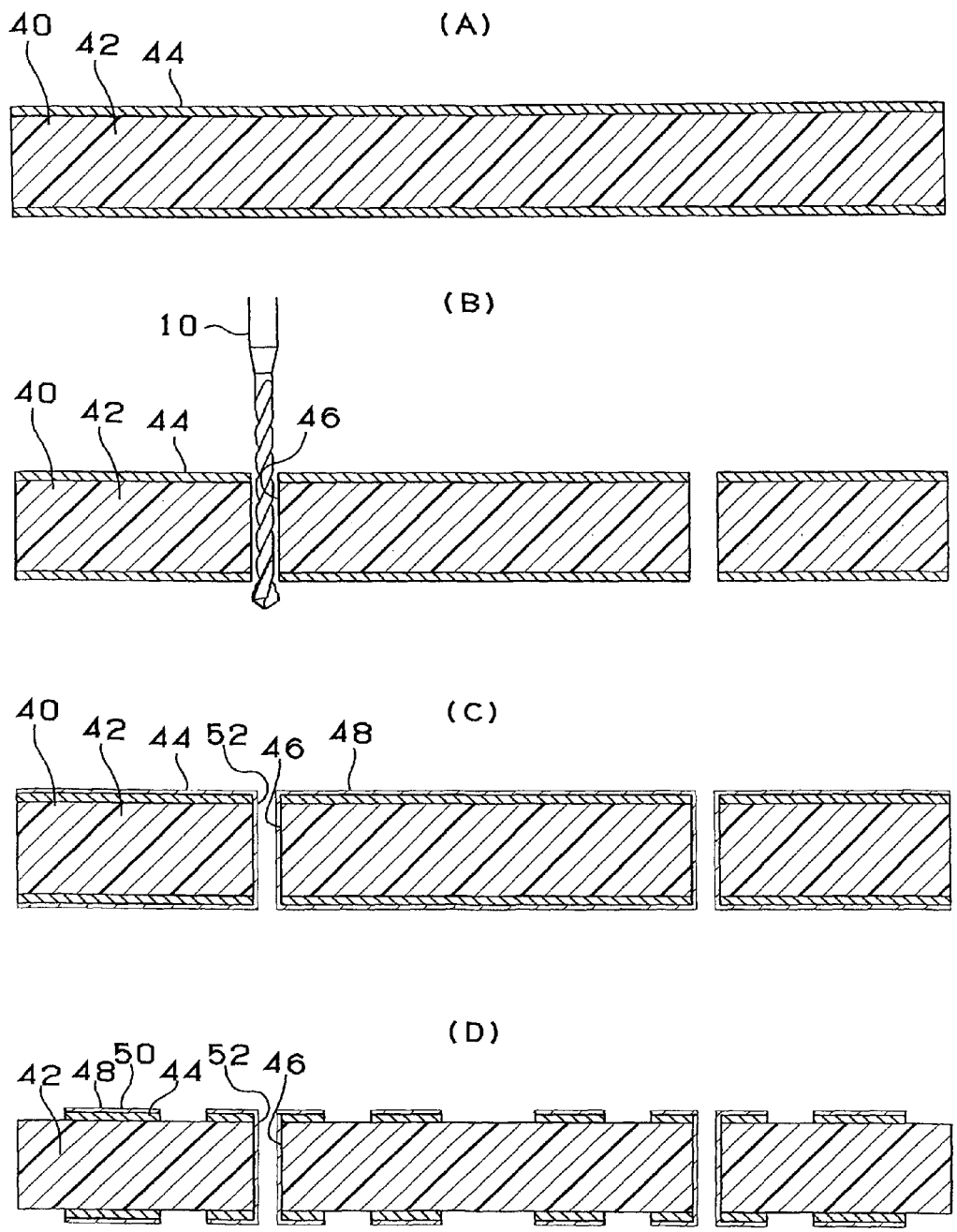

US 8,727,680 B2

CUTTING DRILL AND METHOD FOR MANUFACTURING PRINTED WIRING BOARD

CROSS-REFERENCE TO RELATED APPLICATIONS

The present application claims the benefits of priority to U.S. Application No. 61/221,733, filed Jun. 30, 2009. The contents of that application are incorporated herein by reference in their entirety.

BACKGROUND OF THE INVENTION

1. Field of the Invention

The present invention relates to a cutting drill for making holes in a printed wiring board, and to a method for manufacturing a printed wiring board using the cutting drill.

2. Discussion of the Background

In response to requirements for making highly integrated printed wiring boards, holes to be formed are becoming smaller. To achieve smaller holes, in a cutting drill a rod-shaped drill section with a small diameter of approximately 0.1-3.175 mm, for example, is fixed to a shank section with a relatively large diameter to grip the drill body in a rotation shaft of a machine tool. A hard cemented carbide alloy is usually used for the drill section. A machine tool for drilling printed wiring boards is equipped with a polishing tool for polishing the cutting drill. When the cutting edge of the cutting drill becomes dull, the cutting edge will be reused by repolishing with the polishing tool. Cutting procedures are conducted through repeated repolishing until such reuse is no longer feasible.

Cutting drills for printed wiring boards are roughly divided into two kinds: a straight type described in Japanese Laid-Open Patent Publication 2002-18623; and an undercut type described in Japanese Laid-Open Patent Publication 2002-137110. In a straight type, a rod-shaped drill section is formed to have a constant diameter. In an undercut type, a rod-shaped drill section is formed to have a diameter approximately 0.01-0.03 mm smaller in the area positioned approximately 1-5 mm down from the tip. In an undercut type, only the blade portion positioned between the tip and the area 1-5 mm down from the tip makes contact with the inner-wall surface of a hole being processed, and the portion with a smaller diameter does not make contact with the inner-wall surface. Thus, the contact area on the surface of the hole being processed may be reduced, and the surface accuracy of the inner-wall surface of the hole being processed may be enhanced. The contents of these publications are incorporated herein by reference in their entirety.

SUMMARY OF THE INVENTION

According to one aspect of the present invention, a cutting drill includes a shank having a hole and formed to be gripped in a tool holder, and a drill body having a rod shape and locked into the hole of the shank. The shank has an axis around which the drill body rotates. The drill body has a cutting-edge portion forming a tip portion of the drill body and a neck portion having a diameter smaller than a diameter of the cutting-edge portion. The cutting-edge portion has a first cutting-edge portion and a second cutting-edge portion formed between the first cutting-edge portion and the neck portion. The first cutting-edge portion is contiguous to the second cutting-edge portion by a step portion such that the second cutting-edge portion has a diameter which is smaller than a diameter of the first cutting-edge portion.

According to another aspect of the present invention, a method for manufacturing a printed wiring board includes forming a penetrating hole in a base material for a printed wiring board, using a cutting drill having a shank gripped in a tool holder and a drill body having a rod shape and locked into the hole of the shank, forming a conductive layer in the penetrating hole such that the conductive layer extends between upper and lower surfaces of the base material for electrical connection, and forming a conductive circuit on one or both surfaces of the base material. The shank has an axis around which the drill body rotates. The drill body has a cutting-edge portion forming a tip portion of the drill body and a neck portion having a diameter smaller than a diameter of the cutting-edge portion. The cutting-edge portion has a first cutting-edge portion and a second cutting-edge portion formed between the first cutting-edge portion and the neck portion. The first cutting-edge portion is contiguous to the second cutting-edge portion by a step portion such that the second cutting-edge portion has a diameter which is smaller than a diameter of the first cutting-edge portion.

According to yet another aspect of the present invention, a method for forming a penetrating hole for a printed wiring board includes providing a cutting drill having a shank gripped in a tool holder and a drill body having a rod shape and locked into the hole of the shank, forming a penetrating hole in a base material for a printed wiring board with the cutting drill, forming a conductive layer in the penetrating hole such that the conductive layer extends between upper and lower surfaces of the base material for electrical connection, and forming a conductive circuit on one or both surfaces of the base material. The shank has an axis around which the drill body rotates. The drill body has a cutting-edge portion forming a tip portion of the drill body and a neck portion having a diameter smaller than a diameter of the cutting-edge portion. The cutting-edge portion has a first cutting-edge portion and a second cutting-edge portion formed between the first cutting-edge portion and the neck portion. The first cutting-edge portion is contiguous to the second cutting-edge portion by a step portion such that the second cutting-edge portion has a diameter which is smaller than a diameter of the first cutting-edge portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a side view of a cutting drill according to the First Embodiment of the present invention;

FIG. 1B is a magnified view of a cutting-edge section;

FIG. 1C is a magnified view of the cutting-edge section with a first cutting-edge portion removed;

FIG. 1D is a schematic view of the cutting-edge section;

FIG. 3A is a side view of a cutting drill according to the Second Embodiment;

FIG. 3B is a perspective view of a cutting-edge section seen from (b1);

FIG. 4A is a side view of a cutting drill according to a modified example of the Second Embodiment;

FIG. 4B is a perspective view of a cutting-edge section seen from (b2);

FIG. 5 are views showing the processing steps using a cutting drill of the First Embodiment;

DETAILED DESCRIPTION OF THE EMBODIMENTS

Figure 2:
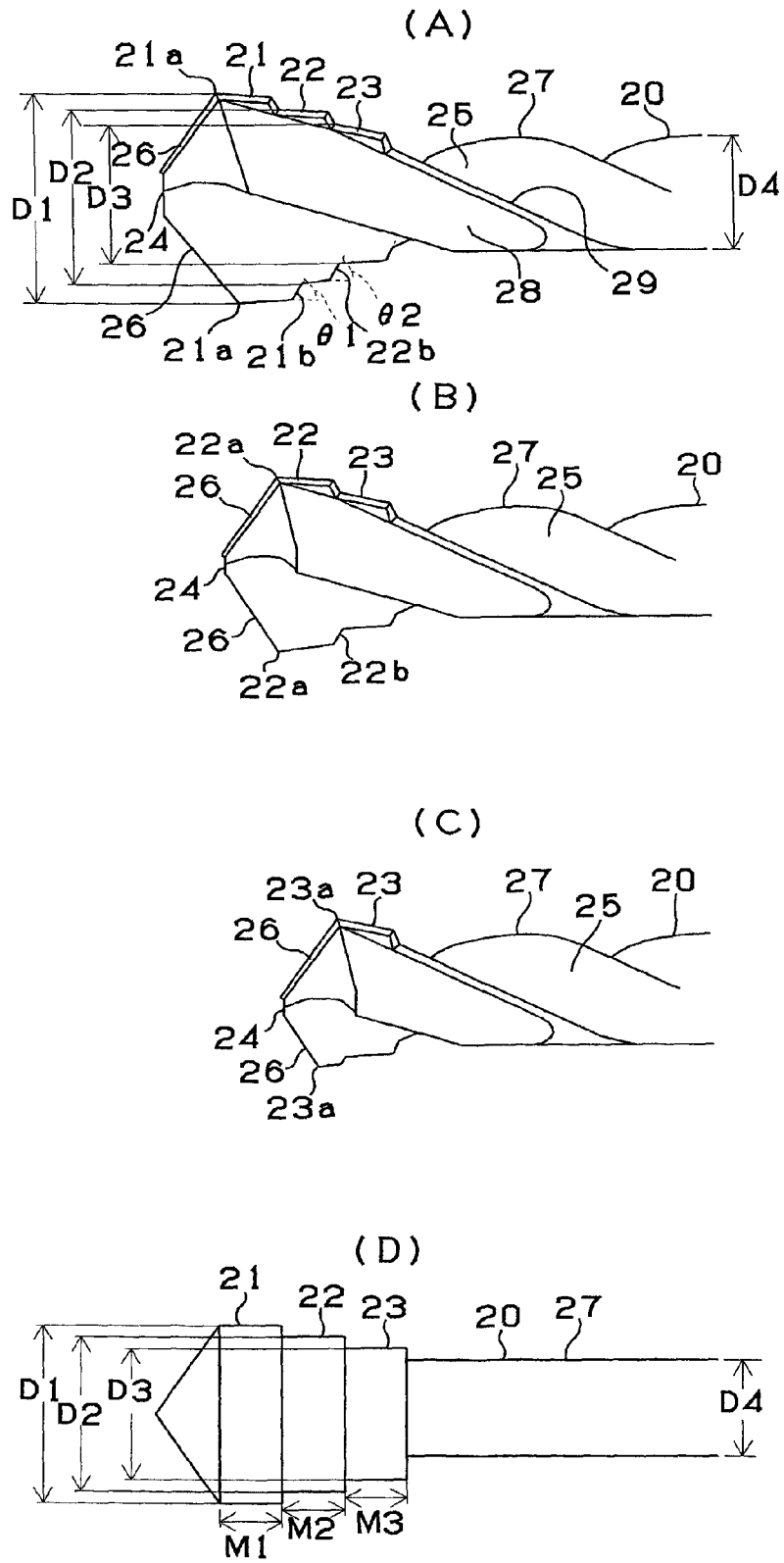
FIG. 2A is a magnified view of a cutting-edge section of a cutting drill according to a modified example of the First Embodiment.
FIG. 2B is a magnified view of the cutting-edge section with a first cutting-edge portion removed.
FIG. 2C is a magnified view of the cutting-edge section with a second cutting-edge portion removed.
FIG. 2D is a schematic view of the cutting-edge section.

The embodiments will now be described with reference to the accompanying drawings, wherein like reference numerals designate corresponding or identical elements throughout the various drawings.

First Embodiment

Cutting drill 10 according to the First Embodiment of the present invention is described with reference to FIG. 1. FIG. 1A is a side view of a cutting drill according to the First Embodiment of the present invention; FIG. 1B is a magnified view of a cutting-edge section; FIG. 1C is a magnified view of the cutting-edge section with a first cutting-edge portion removed; and FIG. 1D is a schematic view of the cutting-edge section.

As shown in FIG. 1A, cutting drill 10 is formed with shank 30 to be gripped by a tool holder, and small-diameter rod-shaped drill body 20 to be locked into hole 32 of shank 30. In drill body 20, base section (20B) with a greater diameter than the cutting-edge side is fixed to hole 32 of shank 30. Drill body 20 is formed to be replaceable in shank 30 so that the shank may be used for a long duration to reduce processing costs.

As shown in FIG. 1B, at the tip of drill body 20, a pair of tip cutting lips (26, 26) are formed, and the portion between tip cutting lip 26 and tip cutting lip 26 is drill point 24. At the ends of tip cutting lips (26, 26), cutting-edge corners (21a, 21a) are formed. In the peripheral area of tip cutting lips (26, 26), double spiral flutes 25 are formed. In a land left remaining by spiral flutes 25, first cutting-edge portion (first margin portion) 21, second cutting-edge portion (second margin portion) 22, peripheral cutting lip 29 and peripheral relief 28 are formed. First cutting-edge portion 21 and second cutting-edge portion 22, which is contiguous to first cutting-edge portion 21, are formed to be contiguous through step portion (21b) arranged on the rear side of the first cutting-edge portion. Step portion (21b) tapers with a diameter decreasing from the base end of first cutting-edge portion 21 toward the shank side. Included angle (θ1) made by a tangent to the taper of step portion (21b) and the axis of drill body 20 is set to be between 10-80 degrees.

FIG. 1D schematically shows first cutting-edge portion (first margin portion) 21, second cutting-edge portion (second margin portion) 22, and neck section 27. First cutting-edge portion (first margin portion) 21 is formed to have diameter (D1): 0.26 mm and length (M1) in the axis direction: 0.6 mm. Second cutting-edge portion (second margin portion) 22 is formed to have diameter (D2): 0.25 mm and length (M2) in the axis direction: 0.6 mm. Meanwhile, neck section 27 is formed to have diameter (D4): 0.24 mm.

FIG. 1C is a magnified view of the cutting-edge section with a first cutting-edge portion removed. Cutting drill 10 of the First Embodiment is used repeatedly for the drilling process in a printed wiring board, and when tip cutting lips (26, 26) become dull, they are polished for reuse. After such polishing, when the length of first cutting-edge portion (first margin portion) 21 in the axis direction reaches a threshold value (0.35 mm) to enable highly accurate cutting, the first cutting-edge portion is removed. Then, as shown in FIG. 1C, tip cutting lips (26, 26) are formed at the tip of second cutting-edge portion 22, and cutting-edge corners (22a, 22a) are formed at the ends of tip cutting lips (26, 26).

In cutting drill 10 of the First Embodiment, first cutting-edge portion 21 and second cutting-edge portion 22, which has a smaller diameter than first cutting-edge portion 21, are formed. Thus, only first cutting-edge portion 21, which has a greater diameter and is positioned at the tip, may be allowed to make contact with a printed wiring board. Namely, when using first cutting-edge portion 21 to conduct a cutting process, second cutting-edge portion 22 and neck section 27, which have smaller diameters than first cutting-edge portion 21, seldom make contact with a workpiece (printed wiring board). Thus, compared with a conventional straight-type drill, the area where the cutting-edge section makes contact with the workpiece may be reduced, the cutting resistance generated during the cutting may decrease, and damage to the cutting edge may be suppressed. Moreover, when repolishing, only first cutting-edge portion 21, which makes contact with the workpiece, is required to be polished. Accordingly, compared with a conventional straight-type drill, the amount of processing is reduced, potentially leading to a reduction in processing costs and an increase in productivity. When the life span of the first cutting-edge portion has expired, the drill may be reused through a simple method such as removing the first cutting-edge portion from the bottom of step portion (21b) and exposing the tip of second cutting-edge portion 22, as shown in FIG. 1C.

In cutting drill 10 of the First Embodiment, after repeated repolishings, when the length of first cutting-edge portion 21 in the axis direction (for example, the initial length of 0.6 mm) reaches the minimum length (for example, 0.35 mm) to enable highly accurate cutting, first cutting-edge portion 21 is removed, and the tip of second cutting-edge portion 22 is exposed (FIG. 1C). By doing so, the life span of the cutting drill may be extended by the sharpening allowance of second cutting-edge portion 22 lengthwise in the axis direction, for example, 0.25 mm. Namely, the life span of the cutting drill may double the life span of products of conventional technology.

In cutting drill 10 of the First Embodiment, step portion (21B) between first cutting-edge portion 21 and second cutting-edge portion 22 tapers, with the diameter decreasing toward the shank side. Thus, after cutting, an edge of copper foil in a printed wiring board will not be grabbed by step portion (21b) and the drill may be smoothly pulled out from a workpiece. At the same time, damage to drill body 20 during the pullout may be suppressed.

In cutting drill 10 of the First Embodiment, included angle (θ1), made by a tangent to the taper of step portion (21b) between first cutting-edge portion 21 and second cutting-edge portion 22 and the axis, is set between 10-80 degrees. Here, if included angle (θ1) is less than 10 degrees, second cutting-edge portion 22 is highly likely to make contact with a workpiece while cutting with first cutting-edge portion 21, and second cutting-edge portion 22 will be worn. On the other hand, if included angle (θ1) exceeds 80 degrees, an edge of copper foil in a printed wiring board will be grabbed by step portion (21b) after cutting, for example, and drill body 20 may be damaged easily during the pullout.

When the length of first cutting-edge portion 21 in the axis direction is set as (M1), and the length of the exposed portion of drill body 20 from shank 30 in the axis direction is set as (L), if the relationship 4M1<L<20M1 is satisfied, it is preferred for cutting accuracy and a reduction of damage.

Also, the above shank may be the shank section of a cutting tool from which a cutting-edge section is removed when the cutting-edge section wears away. In such a case, the shank section, which makes up the majority of a cutting drill, may be reused, providing a cutting drill whose performance is equal to that of a new one, thus contributing to cost reduction.

In the following, processing a printed wiring board using a cutting drill of the First Embodiment is described with reference to FIG. 5.

(1) Copper-clad laminate 40 is used, formed by laminating copper foil 44 with a thickness of 18 μm on both surfaces of substrate 42 made of glass epoxy resin or BT (bismaleimide triazine) resin with a thickness of 0.8 mm (FIG. 5A).

(2) Copper-clad laminate 40 is drilled using cutting drill 10 of the First Embodiment to form penetrating hole 46 for a through-hole at a predetermined spot (FIG. 5B).

(3) Electroless copper plating is performed on substrate 42 to form copper-plated film 48, and through-hole conductor 52 is formed in penetrating hole 46 for a through-hole (FIG. 5C).

(4) Copper foil 44 and copper-plated film 48 are patterned by etching using a standard method and conductive circuits 50 are formed on both surfaces of substrate 42 (FIG. 5D).

Modified Example of the First Embodiment

Cutting drill 10 according to a modified example of the First Embodiment of the present invention is described with reference to FIG. 2. FIG. 2A is a magnified view of a cutting-edge section of a cutting drill according to a modified example of the First Embodiment; FIG. 2B is a magnified view of the cutting-edge section with a first cutting-edge portion removed; FIG. 2C is a magnified view of the cutting-edge section with a second cutting-edge portion removed; and FIG. 2D is a schematic view of the cutting-edge section. The same as in the First Embodiment, in cutting drill 10 according to a modified example of the First Embodiment, drill body 20 is gripped by a shank, not shown in the drawings.

As shown in FIG. 2A, at the tip of drill body 20, a pair of tip cutting lips (26, 26) is formed, and the portion between tip cutting lip 26 and tip cutting lip 26 is drill point 24. At the ends of tip cutting lips (26, 26), cutting-edge corners (21a, 21a) are formed. In the peripheral portions of tip cutting lips (26, 26), double spiral flutes 25 are formed. In a land left remaining by spiral flutes 25, first cutting-edge portion (first margin portion) 21, second cutting-edge portion (second margin portion) 22, third cutting-edge portion (third margin portion) 23, peripheral cutting lip 29 and peripheral relief 28 are formed. First cutting-edge portion 21 and second cutting-edge portion 22 are formed to be contiguous through first step portion (21b), and second cutting-edge portion 22 and third cutting-edge portion 23 are formed to be contiguous through second step portion (22b). First step portion (21b) and second step portion (22b) taper with diameters decreasing from the base ends of first cutting-edge portion 21 and second cutting-edge portion 22 toward the shank side. Included angle (θ1) made by a tangent to the taper of first step portion (21b) and the axis, and included angle (θ2) made by a tangent to the taper of second step portion (22b) and the axis, are set to be between 10-80 degrees.

FIG. 2D schematically shows first cutting-edge portion (first margin portion) 21, second cutting-edge portion (second margin portion) 22, third cutting-edge portion (second margin portion) 23, and neck section 27. First cutting-edge portion (first margin portion) 21 is formed to have diameter (D1): 0.26 mm and length (M1) in the axis direction: 0.6 mm. Second cutting-edge portion (second margin portion) 22 is formed to have diameter (D2): 0.25 mm and length (M2) in the axis direction: 0.6 mm. Third cutting-edge portion (third margin portion) 23 is formed to have diameter (D3): 0.25 mm and length (M3) in the axis direction: 0.6 mm. Meanwhile, neck section 27 is formed to have diameter (D4): 0.23 mm.

FIG. 2B is a magnified view of the cutting-edge section with a first cutting-edge portion removed. Cutting drill 10 of a modified example of the First Embodiment is used repeatedly for the drilling process in a printed wiring board, and when tip cutting lips (26, 26) become dull, they are polished for reuse. After such polishing, when the length of first cutting-edge portion (first margin portion) 21 in the axis direction reaches a threshold value (0.35 mm) to enable highly accurate cutting, the first cutting-edge portion is removed. Then, as shown in FIG. 2B, tip cutting lips (26, 26) are formed at the tip of second cutting-edge portion 22, and cutting-edge corners (22a, 22a) are formed at the ends of tip cutting lips (26, 26).

FIG. 2C is a magnified view of the cutting-edge section with a second cutting-edge portion removed. When tip cutting lips (26, 26) of second cutting-edge portion 22 become dull, they are polished for reuse. After such polishing, when the length of second cutting-edge portion (second margin portion) 22 in the axis direction reaches a threshold value (0.35 mm) to enable highly accurate cutting, the second cutting-edge portion is removed. Then, as shown in FIG. 2C, tip cutting lips (26, 26) are formed at the tip of third cutting-edge portion 23, and cutting-edge corners (23a, 23a) are formed at the ends of tip cutting lips (26, 26).

Regarding cutting drill 10 of a modified example of the First Embodiment, when cutting with first cutting-edge portion 21, only first cutting-edge portion 21, which has a greater diameter and is positioned at the tip, may be allowed to make contact with a printed wiring board. Moreover, when cutting with second cutting-edge portion 22, only second cutting-edge portion 22, which has a greater diameter and is positioned at the tip, may be allowed to make contact with a printed wiring board. Namely, when using first cutting-edge portion 21 to conduct a cutting process, second cutting-edge portion 22 and neck section 27, which have smaller diameters than first cutting-edge portion 21, seldom make contact with a workpiece (printed wiring board). In the same manner, when using second cutting-edge portion 22 to conduct a cutting process, third cutting-edge portion 23 and neck section 27, which have smaller diameters than second cutting-edge portion 22, seldom make contact with a workpiece (printed wiring board). Thus, compared with a conventional straight-type drill, the area where the cutting edge makes contact with the workpiece may be reduced, the cutting resistance generated during cutting may decrease, and damage to the cutting edge may be suppressed. Moreover, when repolishing, only first cutting-edge portion 21 and second cutting-edge portion 22, which make contact with the workpiece, are required to be polished. Accordingly, compared with a conventional straight-type drill, the amount of processing is reduced, potentially leading to a reduction in processing costs and an increase in productivity. The drill may be reused through a simple method such as removing the first cutting-edge portion and exposing the tip of second cutting-edge portion 22 when the life span of the first cutting-edge portion has expired, as shown in FIG. 2B; and removing the second cutting-edge portion and exposing the tip of third cutting-edge portion 23 when the life span of the second cutting-edge portion has expired, as shown in FIG. 2C.

In cutting drill 10 of a modified example of the First Embodiment, after repeated repolishings, when the length of first cutting-edge portion 21 in the axis direction (the initial length of 0.6 mm) reaches the minimum length (0.35 mm) to enable highly accurate cutting, first cutting-edge portion 21 is removed and the tip of second cutting-edge portion 22 is exposed (FIG. 2B). By doing so, the life span of the cutting drill may be extended by 0.25 mm, which is the sharpening allowance of second cutting-edge portion 22 lengthwise in the axis direction. Moreover, after repeated repolishings, when the length of second cutting-edge portion 22 in the axis direction (the initial length of 0.6 mm) reaches the minimum length (0.35 mm) to enable highly accurate cutting, second cutting-edge portion 22 is removed and the tip of third cutting-edge portion 23 is exposed (FIG. 2C). By doing so, the life span of the cutting drill may be extended by 0.25 mm, which is the sharpening allowance of third cutting-edge portion 23 lengthwise in the axis direction. Namely, the life span of the cutting drill may triple the life span of products of conventional technology.

Second Embodiment

Cutting drill 10 according to the Second Embodiment of the present invention is described with reference to FIG. 3. FIG. 3A is a side view of a cutting drill according to the Second Embodiment; and FIG. 3B is a perspective view of a cutting-edge section seen from (b1). In the First Embodiment described above with reference to FIG. 1, double spiral flutes 25 were formed in the drill body. By contrast, single spiral flute 25 is formed in drill body 20 in the Second Embodiment.

At the tip of drill body 20, tip cutting lip 26 is formed, and one end of tip cutting lip 26 in the center is drill point 24. Single spiral flute 25 is formed in the peripheral portion of tip cutting lip 26. In a land left remaining by spiral flute 25, first cutting-edge portion (first margin portion) 21, second cutting-edge portion (second margin portion) 22 and peripheral cutting lip 29 are formed. First cutting-edge portion 21 and second cutting-edge portion 22, which is contiguous to first cutting-edge portion 21, are formed to be contiguous through step portion (21b) arranged on the rear side of the first cutting-edge portion.

In cutting drill 10 of the Second Embodiment, first cutting-edge portion 21 and second cutting-edge portion 22, which has a smaller diameter than first cutting-edge portion 21, are formed. Thus, only first cutting-edge portion 21, which has a greater diameter and is positioned at the tip, may be allowed to make contact with a printed wiring board during the cutting process. Accordingly, compared with a conventional straight-type drill, the area where the cutting edge makes contact with a workpiece may be reduced, the cutting resistance generated during cutting may decrease, and damage to the cutting edge may be suppressed. Moreover, only first cutting-edge portion 21, which makes contact with a workpiece, is required to be polished during the repolishing process. Therefore, compared with a conventional straight-type drill, the amount of processing is reduced, potentially leading to a reduction in processing costs and an increase in productivity. When the life span of the first cutting-edge portion has expired, the drill may be reused through a simple method such as removing the first cutting-edge portion and exposing the tip of second cutting-edge portion 22.

In cutting drill 10 of the Second Embodiment, after repeated repolishings, when the length of first cutting-edge portion 21 in the axis direction reaches the minimum length to enable highly accurate cutting, first cutting-edge portion 21 is removed and the tip of second cutting-edge portion 22 is exposed. By doing so, the life span of the cutting drill may be extended by the amount of the sharpening allowance of second cutting-edge portion 22 lengthwise in the axis direction. Namely, the life span of the cutting drill may double the life span of products of conventional technology.

In the Second Embodiment, cutting accuracy is enhanced by forming single spiral flute 25. However, the life span of the cutting edge will be shorter than that of a drill with double spiral flutes. Thus, a drill with a single spiral flute may be used for a longer duration in the Second Embodiment.

Modified Example of the Second Embodiment

Cutting drill 10 according to a modified example of the Second Embodiment of the present invention is described with reference to FIG. 4. FIG. 4A is a side view of a cutting drill according to a modified example of the Second Embodiment; and FIG. 4B is a perspective view of a cutting-edge section seen from (b2). In a modified example of the Second Embodiment, single spiral flute 25 is formed in drill body 20.

At the tip of drill body 20, tip cutting lip 26 is formed, and one end of tip cutting lip 26 in the center is drill point 24. Single spiral flute 25 is formed in the peripheral portion of tip cutting lip 26. In a land left remaining by spiral flute 25, first cutting-edge portion (first margin portion) 21, second cutting-edge portion (second margin portion) 22, third cutting-edge portion (third margin portion) 23, and peripheral cutting lip 29 are formed. First cutting-edge portion 21 and second cutting-edge portion 22, which is contiguous to first cutting-edge portion 21, are formed to be contiguous through step portion (21b) arranged on the rear side of the first cutting-edge portion. Second cutting-edge portion 22 and third cutting-edge portion 23, which is contiguous to second cutting-edge portion 22, are formed to be contiguous through step portion (23b) arranged on the rear side of the third cutting-edge portion.

In cutting drill 10 according to a modified example of the Second Embodiment, only first cutting-edge portion 21 and second cutting-edge portion 22, which have greater diameters and are positioned at the tip, may be allowed to make contact with a printed wiring board during the cutting process. Thus, compared with a conventional straight-type drill, the area where the cutting edge makes contact with a workpiece may be reduced, the cutting resistance generated during cutting may decrease, and damage to the cutting edge may be reduced. Moreover, only first cutting-edge portion 21 and second cutting-edge portion 22, which make contact with the workpiece, are required to be polished during the repolishing process. Accordingly, compared with a conventional straight-type drill, the amount of processing is reduced, potentially leading to a reduction in processing costs and an increase in productivity. The drill may be reused through a simple method such as removing the first cutting-edge portion and exposing the tip of second cutting-edge portion 22 when the life span of the first cutting-edge portion has expired, and removing the second cutting-edge portion and exposing the tip of third cutting-edge portion 23 when the life span of the second cutting-edge portion has expired.

In cutting drill 10 according to a modified example of the Second Embodiment, after repeated repolishings, when the length of first cutting-edge portion 21 in the axis direction reaches the minimum length to enable highly accurate cutting, first cutting-edge portion 21 is removed and the tip of second cutting-edge portion 22 is exposed. After repeated repolishings, when the length of second cutting-edge portion 22 in the axis direction reaches the minimum length to enable highly accurate cutting, second cutting-edge portion 22 is removed and the tip of third cutting-edge portion 23 is exposed. By doing so, the life span of an undercut-type cutting drill with a single spiral flute may triple the life span of products of conventional technology.

Third Embodiment

Figure 6:
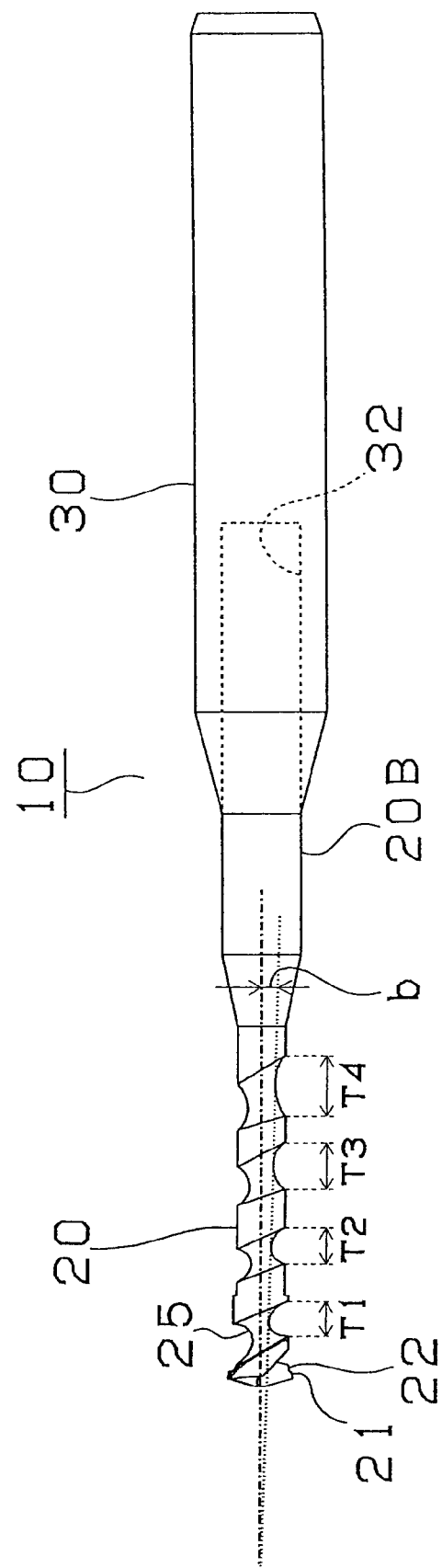
FIG. 6 is a side view of a cutting drill according to the Third Embodiment of the present invention.

Cutting drill 10 according to the Third Embodiment of the present invention is described with reference to FIG. 6. Cutting drill 10 of the Third Embodiment is formed with shank 30 to be gripped by a tool holder, and small-diameter rod-shaped drill body 20 to be locked into hole 32 of shank 30. At the tip of the drill body, first cutting-edge portion (first margin portion) 21, second cutting-edge portion (second margin portion) 22 and double spiral flutes 25 are formed, the same as in the First Embodiment. Spiral flutes 25 are formed with a width gradually increasing from the cutting edge side toward the shank side. Namely, the widths of flutes 25 are formed to satisfy the relationship $T1<T2<T3<T4$ from the cutting-edge side. Also, the depths of flutes 25 are formed to become gradually shallower from the cutting-edge side toward the shank side.

In cutting drill 10 of the Third Embodiment, by widening the flute widths toward the base side, cutting chips will tend to be guided toward the base side, and cutting chips may be suppressed from being plugged. Eliminating plugged cutting chips may prevent lowered alignment accuracy of through-holes, damage to the drill, roughened inner walls of through-holes, burning from generated heat and so forth.

Fourth Embodiment

Figure 7:
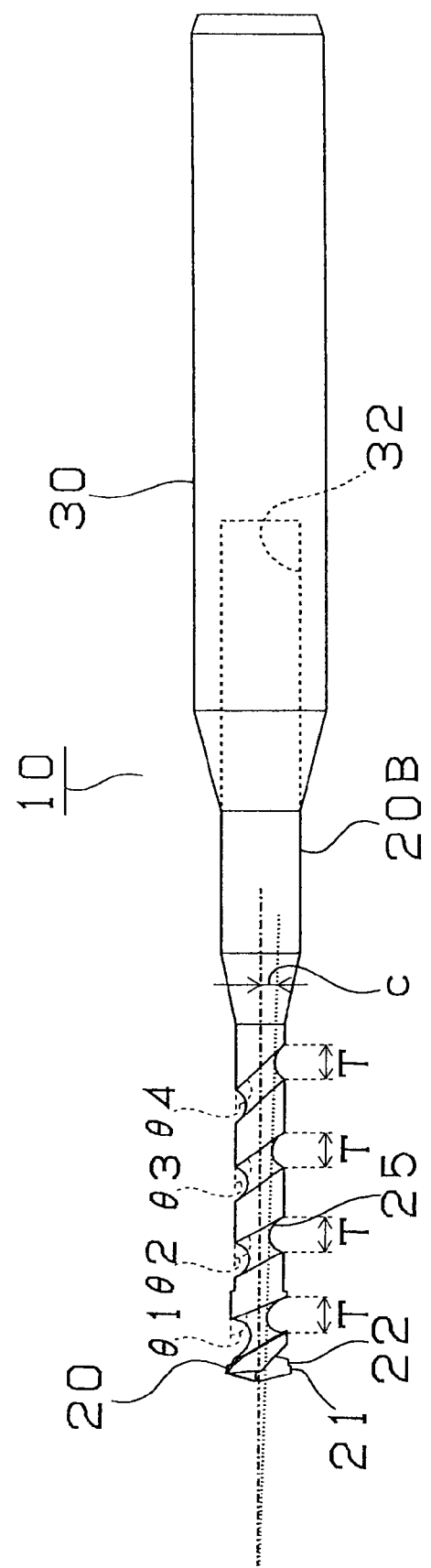
FIG. 7 is a side view of a cutting drill according to the Fourth Embodiment of the present invention.

Cutting drill 10 according to the Fourth Embodiment of the present invention is described with reference to FIG. 7. Cutting drill 10 of the Fourth Embodiment is formed with shank 30 to be gripped by a tool holder, and small-diameter rod-shaped drill body 20 to be locked into hole 32 of shank 30. At the tip of the drill body, first cutting-edge portion (first margin portion) 21, second cutting-edge portion (second margin portion) 22 and double spiral flutes 25 are formed, the same as in the First Embodiment. Spiral flutes 25 are formed with the spiral angles gradually increasing from the cutting-edge side toward the shank side. Namely, the spiral angles of flutes 25 are formed to satisfy the relationship $\theta1<\theta2<\theta3<\theta4$ from the cutting edge side. Also, flutes 25 are formed to have constant width (T).

In cutting drill 10 of the Fourth Embodiment, by increasing the spiral angles toward the base side, feed rates of cutting chips will increase toward the base side, and cutting chips may be suppressed from being plugged. Eliminating plugged cutting chips may prevent lowered alignment accuracy of through-holes, damage to the drill, roughened inner walls of through-holes, burning from generated heat and so forth.

According to one embodiment of the present invention, a cutting drill 10 has shank 30 to be gripped in a tool holder and small-diameter rod-shaped drill body 20 locked into hole 32 of the shank, and rotates around the axis of the shank; in such cutting drill 10, drill body 20 has cutting-edge section (21, 22) at the tip, and neck section 27 with a relatively small diameter compared with that of the cutting-edge section; the cutting-edge section has first cutting-edge portion 21 which is formed on the tip side, and second cutting-edge portion 22 which is formed on the rear side of first cutting-edge portion 21 and is contiguous to first cutting-edge portion 21 by means of step portion (21b); and diameter (D2) of second cutting-edge portion 22 is smaller than diameter (D1) of first cutting-edge portion 21.

In the cutting drill, a first cutting-edge portion and a second cutting-edge portion, which has a smaller diameter than the first cutting-edge portion, are formed in a cutting-edge section. Thus, during the cutting process, only the first cutting-edge portion, which has a greater diameter and is positioned at the tip, may be allowed to make contact with a printed wiring board. Namely, when using the first cutting-edge portion to conduct a cutting process, the second cutting-edge portion and a neck section, which have smaller diameters than the first cutting-edge portion, will seldom make contact with a workpiece (a printed wiring board). Accordingly, compared with a conventional straight-type drill, the area where the cutting edge makes contact with the workpiece may be reduced, cutting resistance generated during cutting may be reduced, and damage to the cutting edge may decrease. Furthermore, when repolishing, only the first cutting-edge portion which makes contact with the workpiece is required to be polished. Thus, compared with a conventional straight-type drill, the amount of processing decreases, potentially leading to a reduction in processing costs and an increase in productivity. When the life span of the first cutting-edge portion expires, the drill may be reused by a simple method such as removing the first cutting-edge portion and exposing the tip of the second cutting-edge portion.

In the above-described embodiments, examples are described in which first cutting-edge portion 21 and second cutting-edge portion 22 are shaved off. However, fourth and fifth cutting-edge portions may also be formed on the cutting-edge side by polishing the area on the neck-section side to be further narrower.

Obviously, numerous modifications and variations of the present invention are possible in light of the above teachings. It is therefore to be understood that within the scope of the appended claims, the invention may be practiced otherwise than as specifically described herein.

What is claimed is:
1. A cutting drill comprising:
a shank having a hole and configured to be gripped in a tool holder; and
a drill body having a rod shape and locked into the hole of the shank,
wherein the shank has an axis around which the drill body rotates, the drill body has a cutting-edge portion forming a tip portion of the drill body and a neck portion having a diameter smaller than a diameter of the cutting-edge portion such that the cutting-edge portion and neck portion are positioned in an exposed portion of the drill body exposed from the shank outside the hole of the shank, the cutting-edge portion has a first cutting-edge portion and a second cutting-edge portion formed between the first cutting-edge portion and the neck portion, and the first cutting-edge portion is contiguous to the second cutting-edge portion by a step portion such that the second cutting-edge portion has a diameter which is smaller than a diameter of the first cutting-edge portion.

2. The cutting drill according to claim 1, wherein the step portion tapers such that a diameter of the step portion decreases from a base end of the first cutting-edge portion toward the shank.

3. The cutting drill according to claim 2, wherein an included angle made by a tangent to the taper of the step portion and the axis is between 10-80 degrees.

4. The cutting drill according to claim 1, wherein the first cutting-edge portion has a length D in an axis direction, the exposed portion of the drill body has a length L in the axis direction, and the length D and the length L satisfy 4D<L<20D.

5. The cutting drill according to claim 1, wherein the first cutting-edge portion has a length in an axis direction which is the same as a length of the second cutting-edge portion in the axis direction.

6. The cutting drill according to claim 1, wherein the cutting-edge portion has a third cutting-edge portion formed between the second cutting-edge portion and the neck portion, the third cutting-edge portion is contiguous to the second cutting-edge portion by a second step portion such that a diameter of the third cutting-edge portion is smaller than the diameter of the second cutting-edge portion.

7. The cutting drill according to claim 1, wherein the drill body is configured to be replaced in the shank.

8. The cutting drill according to claim 1, wherein the first cutting-edge portion of the drill body is configured to be removed.

9. The cutting drill according to claim 1, wherein the drill body has a flute formed with a width gradually increasing from the cutting-edge toward the shank.

10. The cutting drill according to claim 1, wherein the drill body has a flute formed with a spiral angle gradually increasing from the cutting-edge toward the shank.

11. The cutting drill according to claim 1, wherein the step portion tapers such that a diameter of the step portion decreases from a base end of the first cutting-edge portion toward the shank, and the first cutting-edge portion has a length in an axis direction which is the same as a length of the second cutting-edge portion in the axis direction.

12. The cutting drill according to claim 11, wherein an included angle made by a tangent to the taper of the step portion and the axis is between 10-80 degrees.

13. The cutting drill according to claim 1, wherein the first cutting-edge portion has a length D in an axis direction, the exposed portion of the drill body has a length L in the axis direction, and the length D and the length L satisfy 4D<L<20D, and the first cutting-edge portion has a length in an axis direction which is the same as a length of the second cutting-edge portion in the axis direction.

14. The cutting drill according to claim 1, wherein the first cutting-edge portion of the drill body is configured to be removed, and the drill body is configured to be replaced in the shank.

15. The cutting drill according to claim 1, wherein the cutting-edge portion has a third cutting-edge portion formed between the second cutting-edge portion and the neck portion, the third cutting-edge portion is contiguous to the second cutting-edge portion by a second step portion such that a diameter of the third cutting-edge portion is smaller than the diameter of the second cutting-edge portion, and the first cutting-edge portion has a length in an axis direction which is the same as a length of the second cutting-edge portion in the axis direction.

16. The cutting drill according to claim 1, wherein the drill body is configured to be replaced in the shank, and the first cutting-edge portion has a length in an axis direction which is the same as a length of the second cutting-edge portion in the axis direction.

17. The cutting drill according to claim 1, wherein the first cutting-edge portion of the drill body is configured to be removed, and the first cutting-edge portion has a length in an axis direction which is the same as a length of the second cutting-edge portion in the axis direction.

18. The cutting drill according to claim 1, wherein the drill body has a flute formed with a width gradually increasing from the cutting-edge toward the shank, and the first cutting-edge portion has a length in an axis direction which is the same as a length of the second cutting-edge portion in the axis direction.

19. The cutting drill according to claim 1, wherein the drill body has a flute formed with a spiral angle gradually increasing from the cutting-edge toward the shank, and the first cutting-edge portion has a length in an axis direction which is the same as a length of the second cutting-edge portion in the axis direction.

* * * * *